(12) United States Patent
Trinh et al.

(10) Patent No.: US 10,115,896 B1
(45) Date of Patent: Oct. 30, 2018

(54) SEMICONDUCTOR DEVICE AND METHOD OF MANUFACTURING THE SAME

(71) Applicant: TAIWAN SEMICONDUCTOR MANUFACTURING COMPANY LTD., Hsinchu (TW)

(72) Inventors: Hai-Dang Trinh, Hsinchu (TW); Yao-Wen Chang, Taipei (TW); Cheng-Yuan Tsai, Hsin-Chu County (TW); Chin-Wei Liang, Hsinchu County (TW); Yen-Chang Chu, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/486,931

(22) Filed: Apr. 13, 2017

(51) Int. Cl.
*H01L 47/00* (2006.01)
*H01L 45/00* (2006.01)
*H01L 27/24* (2006.01)

(52) U.S. Cl.
CPC ...... *H01L 45/1253* (2013.01); *H01L 27/2463* (2013.01); *H01L 45/1233* (2013.01); *H01L 45/1608* (2013.01)

(58) Field of Classification Search
CPC ............. H01L 27/2472; H01L 27/2463; H01L 45/1246; H01L 45/1253; H01L 45/12; H01L 45/04
See application file for complete search history.

(56) References Cited

U.S. PATENT DOCUMENTS

| | | | |
|---|---|---|---|
| 2005/0111071 A1* | 5/2005 | Kojima | G02F 1/1525 359/265 |
| 2005/0111256 A1* | 5/2005 | Bednorz | G11C 11/22 365/177 |
| 2015/0295172 A1* | 10/2015 | Sung | H01L 45/1253 257/2 |

* cited by examiner

*Primary Examiner* — Yosef Gebreyesus
(74) *Attorney, Agent, or Firm* — WPAT, P.C., Intellectual Property Attorneys; Anthony King

(57) ABSTRACT

A semiconductor device includes a first bottom electrode, a second bottom electrode, a switching layer and a top electrode. The first bottom electrode has two edges opposite to each other, and an upper surface. The second bottom electrode is between the edges of the first bottom electrode and exposed from the upper surface of the first bottom electrode. The switching layer is over the first bottom electrode and the second bottom electrode. The top electrode is over the switching layer.

19 Claims, 10 Drawing Sheets

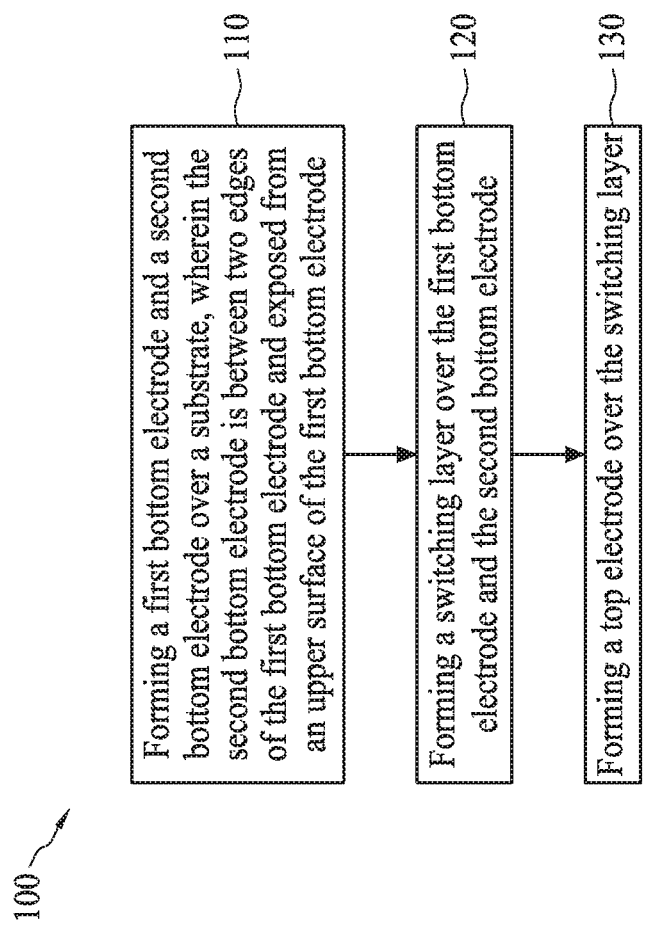

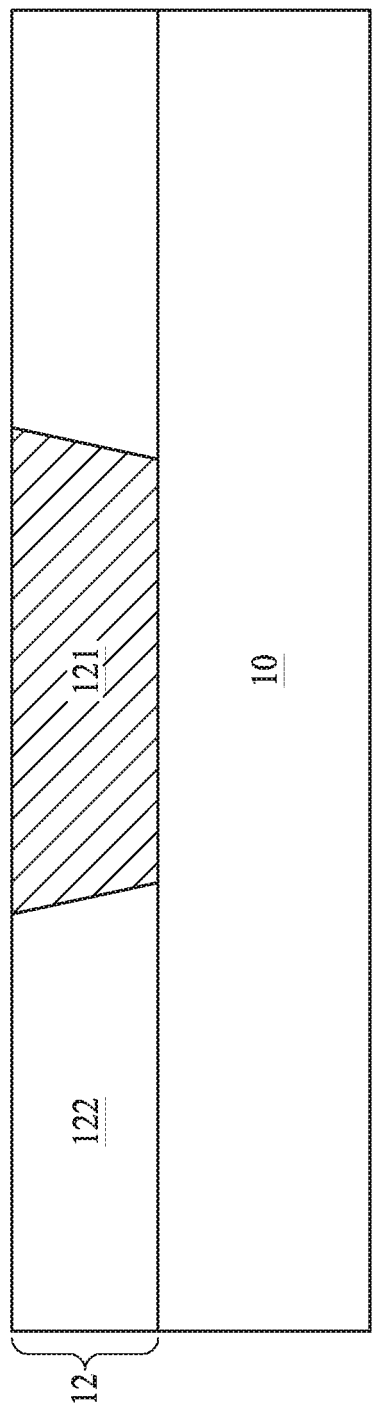

SEMICONDUCTOR DEVICE AND METHOD OF MANUFACTURING THE SAME

BACKGROUND

Electronic memory may be volatile memory or non-volatile memory. Non-volatile memory is able to store data when power is removed, whereas volatile memory is not. Resistive random access memory (RRAM) is one promising candidate for next generation non-volatile memory technology due to its simple structure and its compatibility with complementary metal-oxide-semiconductor (CMOS) logic fabrication processes. The RRAM, however, still suffers from narrow switching window and leakage issues.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIG. 1 is a flow chart illustrating a method for manufacturing a semiconductor device according to various aspects of one or more embodiments of the present disclosure.

FIG. 2A, FIG. 2B, FIG. 2C, FIG. 2D, FIG. 2E, FIG. 2F and FIG. 2G are schematic views at one of various operations of manufacturing a semiconductor device according to one or more embodiments of the present disclosure.

DETAILED DESCRIPTION

Figure 2B:
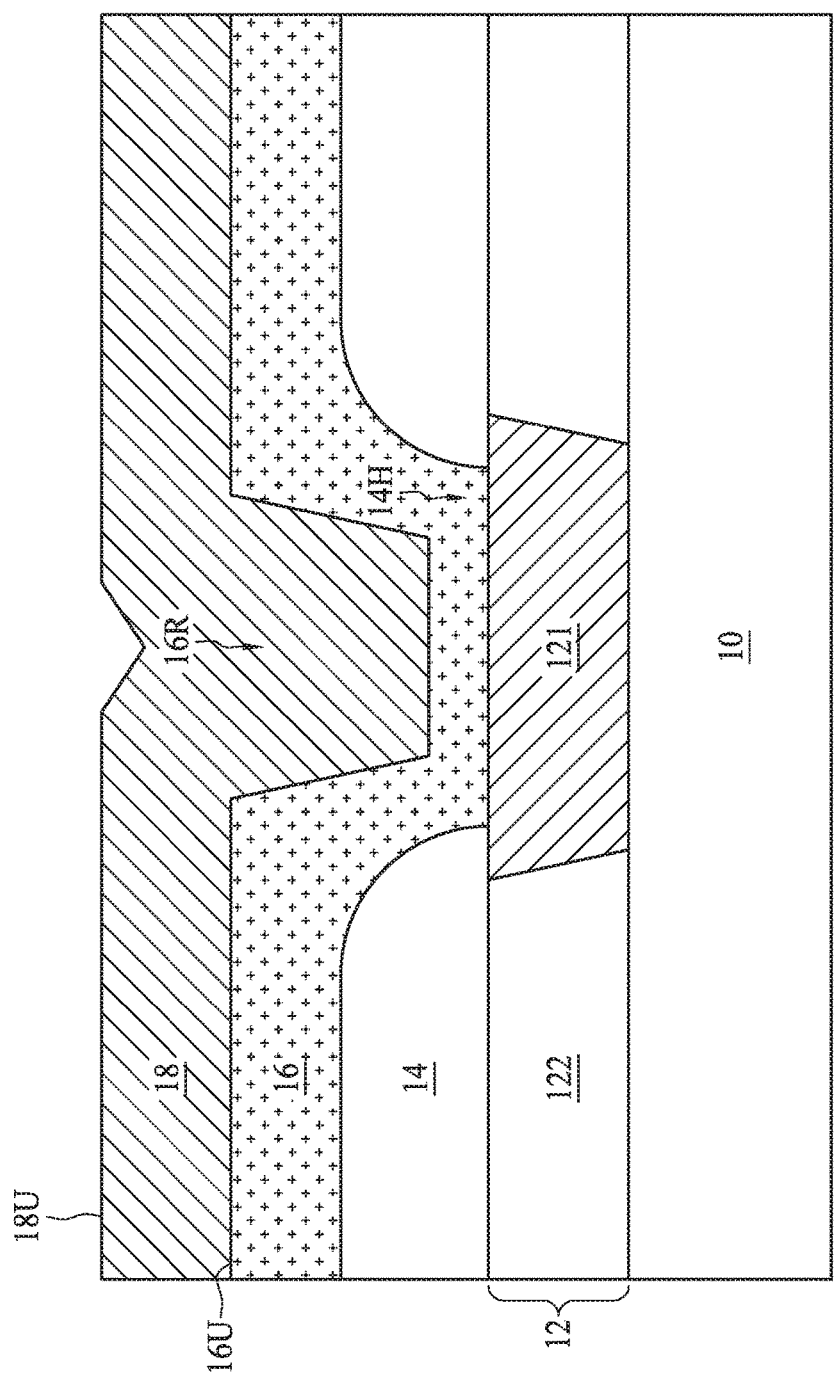

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first" and "second" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±100, such as less than or equal to ±50, less than or equal to ±40, less than or equal to ±30, less than or equal to ±20, less than or equal to ±10, less than or equal to ±0.5°, less than or equal to ±0.10, or less than or equal to ±0.05°. For example, "substantially" perpendicular can refer to a range of angular variation relative to 90° that is less than or equal to ±100, such as less than or equal to ±50, less than or equal to ±4°, less than or equal to ±30, less than or equal to ±2°, less than or equal to ±10, less than or equal to ±0.50, less than or equal to ±0.10, or less than or equal to ±0.05°.

In some embodiments, a semiconductor device such as a resistive random access memory (RRAM) or a conductive bridging random access memory (CBRAM) includes a bottom electrode, a top electrode and a switching layer interposed therebetween. The bottom electrode includes a first bottom electrode with a lower work function and/or lower conductivity, and a higher work function and/or higher conductivity. The first bottom electrode is aligned with edges of the switching layer, and the second bottom electrode is aligned with center of the switching layer. The second bottom electrode is configured to concentrate the electrical field at the center of the switching layer when a voltage is applied across the top electrode and the bottom electrode. The electric field concentrated at the center of the switching layer makes it easy to form the conductive filament(s) near the center of the switching layer away from the edge. Accordingly, the switching window can be increased after cycling and baking, and the forming voltage can be reduced.

FIG. 1 is a flow chart illustrating a method for manufacturing a semiconductor device according to various aspects of one or more embodiments of the present disclosure. The method 100 begins with operation 110 in which a first bottom electrode and a second bottom electrode are formed over a substrate. The second bottom electrode is between two edges of the first bottom electrode and exposed from an upper surface of the first bottom electrode. The method 100 continues with operation 120 in which a switching layer is formed over the first bottom electrode and the second bottom electrode. The method 100 proceeds with operation 130 in which a top electrode is formed over the switching layer.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

FIG. 2A, FIG. 2B, FIG. 2C, FIG. 2D, FIG. 2E, FIG. 2F and FIG. 2G are schematic views at one of various operations of manufacturing a semiconductor device according to one or more embodiments of the present disclosure. As depicted in FIG. 2A, a substrate 10 is received. In some embodiments, the substrate 10 includes a semiconductor substrate. By way of example, the material of the substrate 10 may include elementary semiconductor such as silicon or germanium; a compound semiconductor such as silicon germanium, silicon carbide, gallium arsenic, gallium phosphide, indium phosphide or indium arsenide; or combinations thereof.

In some embodiments, a bottom interconnect structure 12 is formed over the substrate 10. In some embodiments, the bottom interconnect structure 12 includes a bottom metallization layer 121, and a bottom inter-layer dielectric (ILD) layer 122 laterally surrounding the bottom metallization layer 121. In some embodiments, the bottom metallization layer 121 may be one layer of the back-end-of-the line (BEOL). In some embodiments, the material of the bottom metallization layer 121 may include metal or alloy such as copper, tungsten, alloy thereof or the like. The material of the bottom ILD layer 122 may include dielectric material such as low-k dielectric material with a dielectric constant less than 2.0 or the like, but is not limited thereto.

As depicted in FIG. 2B, a dielectric layer 14 is formed over the substrate 10. In some embodiments, the dielectric layer 14 is formed over the bottom interconnect structure 12 and includes a gap 14G exposing the bottom metallization layer 121. In some embodiments, the material of the dielectric layer 14 may include dielectric material such as silicon oxide, silicon nitride, silicon oxynitride or the like. In some embodiments, a first conductive layer 16 is formed over the dielectric layer 14 and covering the gap 14H. In some embodiments, a recess 16R recessed from a portion of an upper surface 16U of the first conductive layer 16 is formed due to the profile of the gap 14H when the first conductive layer 16 is formed over the dielectric layer 14. In some embodiments, a second conductive layer 18 is formed over the first conductive layer 16 and filled in the recess 16R. In some embodiments, a work function of the second conductive layer 18 is higher than a work function of the first conductive layer 16. For example, a work function difference between the second conductive layer 18 and the first conductive layer 16 is substantially greater than 0.3 eV. In some embodiments, a conductivity of the second conductive layer 18 is higher than a conductivity of the first conductive layer 16. For example, a conductivity ratio of the second conductive layer 18 to the first conductive layer 16 is substantially greater than 2. In some embodiments, the materials for the first conductive layer 16 and the second conductive layer 18 may include conductive materials with different ingredients, or conductive materials with a same ingredient and with different ingredient ratios as long as the work function of the second conductive layer 18 is higher than the work function of the first conductive layer 16 and/or the conductivity of the second conductive layer 18 is higher than the conductivity of the first conductive layer 16. In some embodiments, the material of the first conductive layer 16 may include a first metal, and the material of the second conductive layer 18 may include a second metal which has higher work function and conductivity than the first metal of the first conductive layer 16. In some embodiments, the material of the first conductive layer 16 may include a metal, and the material of the second conductive layer 18 may include a metal compound which has higher work function and conductivity than the metal of the first conductive layer 16. In some embodiments, the material of the first conductive layer 16 may include a metal compound, and the material of the second conductive layer 18 may include a metal which has higher work function and conductivity than the metal compound of the first conductive layer 16. In some embodiments, the material of the first conductive layer 16 may include a first metal compound, and the material of the second conductive layer 18 may include a second metal compound which has higher work function and conductivity than the first metal compound of the first conductive layer 16. In some embodiments, the first metal compound and the second metal compound include the same ingredient such as titanium nitride but have different nitrogen concentrations. By way of example, the first metal compound may include titanium nitride or tantalum nitride with higher nitrogen concentration, while the second metal compound may include titanium nitride or tantalum nitride with lower nitrogen concentration.

Examples of materials for the first conductive layer 16 and the second conductive layer 18 are listed in Table 1.

TABLE 1

| Material | Work function (eV) | Resistivity (Ω * m) | Remark |
|---|---|---|---|
| TiN | 4.15-4.8 | 50-300 * $10^{-8}$ | first conductive layer 16/second conductive layer 18 |
| TaN | 3.5-4.6 | 240-5000 * $10^{-8}$ | first conductive layer 16/second conductive layer 18 |
| WN | 4.3-4.5 | 300 * $10^{-8}$ | first conductive layer 16 |
| Ti | 4.1 | 42 * $10^{-8}$ | first conductive layer 16 |
| Ta | 4.22 | 131 * $10^{-8}$ | first conductive layer 16 |
| W | 4.6 | 5.6 * $10^{-8}$ | second conductive layer 18 |
| Pt | 5.4 | 10 * $10^{-8}$ | second conductive layer 18 |
| Ru | 4.8 | 7.1 * $10^{-8}$ | second conductive layer 18 |
| Ni | 5.2 | 6.9 * $10^{-8}$ | second conductive layer 18 |
| Ir | 5.6 | 4.71 * $10^{-8}$ | second conductive layer 18 |

Figure 2C:
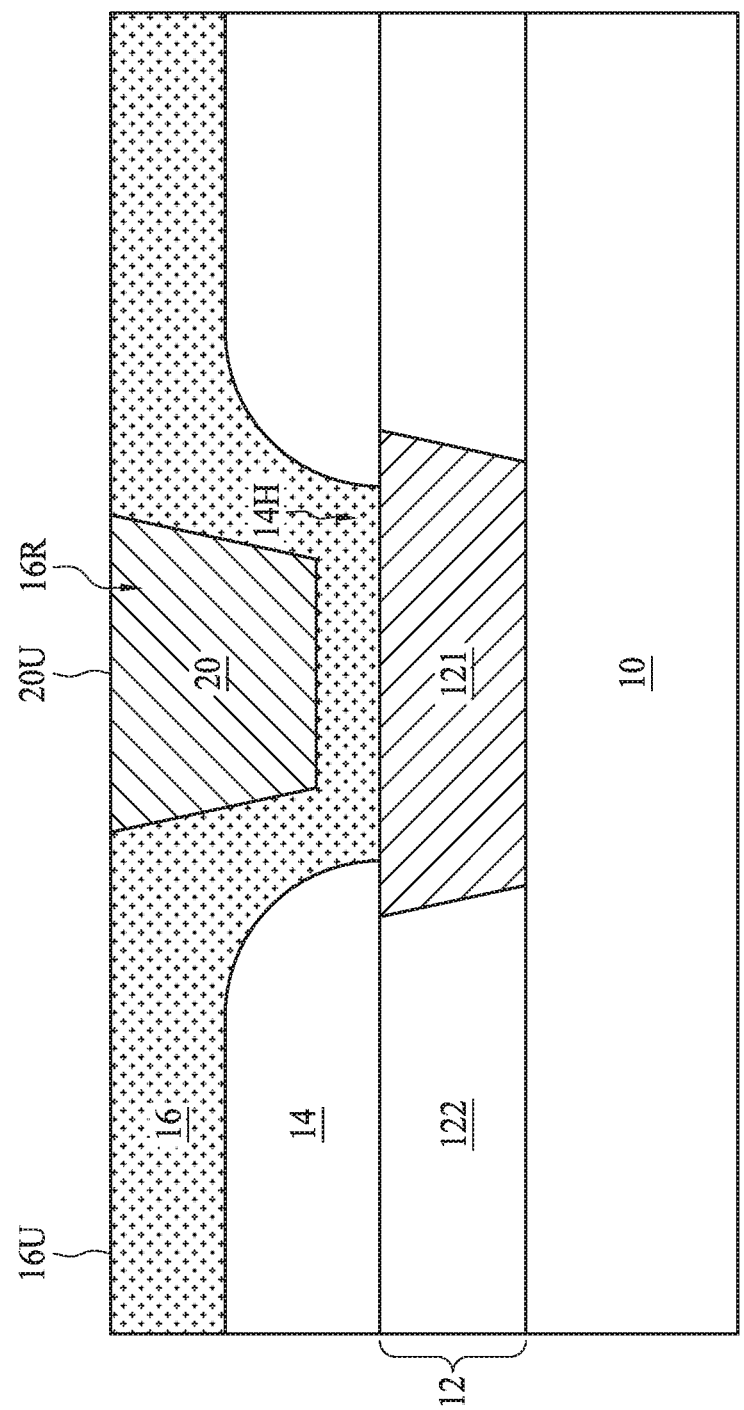

As depicted in FIG. 2C, a portion of the second conductive layer 18 is removed to form a second bottom electrode 20. In some embodiments, the portion of the second conductive layer 18 outside the recess 16R is removed such that the second conductive layer 18 remaining in the recess 16R forms the second bottom electrode 20. In some embodiments, the portion of the second conductive layer 18 outside the recess 16R is removed by a planarization operation such as chemical mechanical polishing (CMP). In some embodiments, an upper surface 20U of the second bottom electrode 20 and the upper surface 16U of the first conductive layer 16 are substantially coplanar.

Figure 2D:
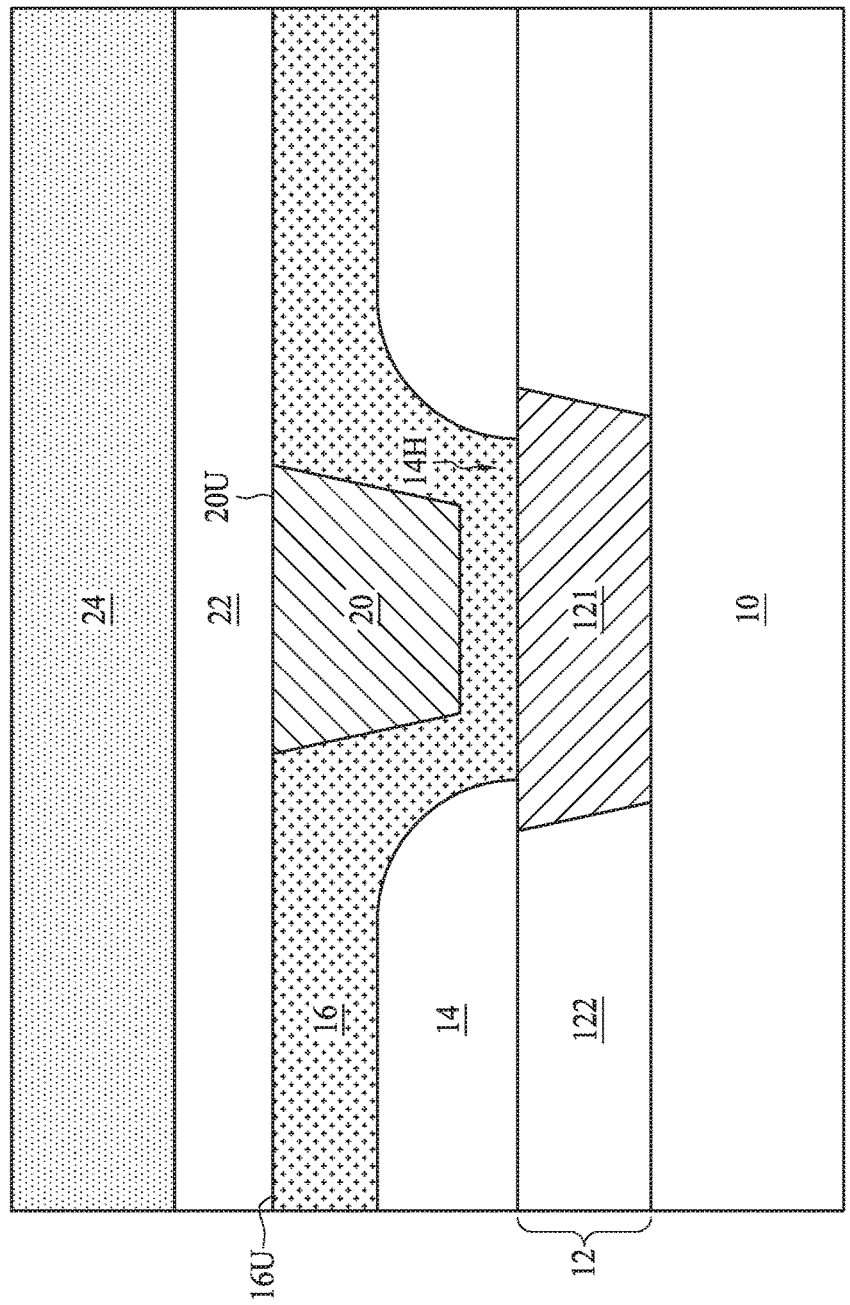

As depicted in FIG. 2D, a switching layer 22 is formed over the first conductive layer 16. In some embodiments, the switching layer 22 is configured to have a variable resistance depending on different electric fields are applied. In some embodiments, the switching layer 22 is, but not limited to be, a high-k dielectric having a dielectric constant greater than 3.9. In some embodiments, the material of the switching layer 22 includes, but is not limited to, metal oxide such as hafnium oxide, tantalum oxide, aluminum oxide, silicon oxide, hafnium tantalum oxide, hafnium aluminum oxide, aluminum tantalum oxide or the like. In some embodiments, the material of the switching layer 22 includes, but is not limited to, semiconductive material such as amorphous silicon, germanium selenide, germanium telluride or the like. In some embodiments, the first conductive layer 16 and the second bottom electrode 20 may be in contact with the switching layer 22. In some embodiments, a third conductive layer 24 is formed over the switching layer 22. In some embodiments, the material of the third conductive layer 24 may include metal or alloy such as copper, tungsten, alloy thereof or the like.

Figure 2E:
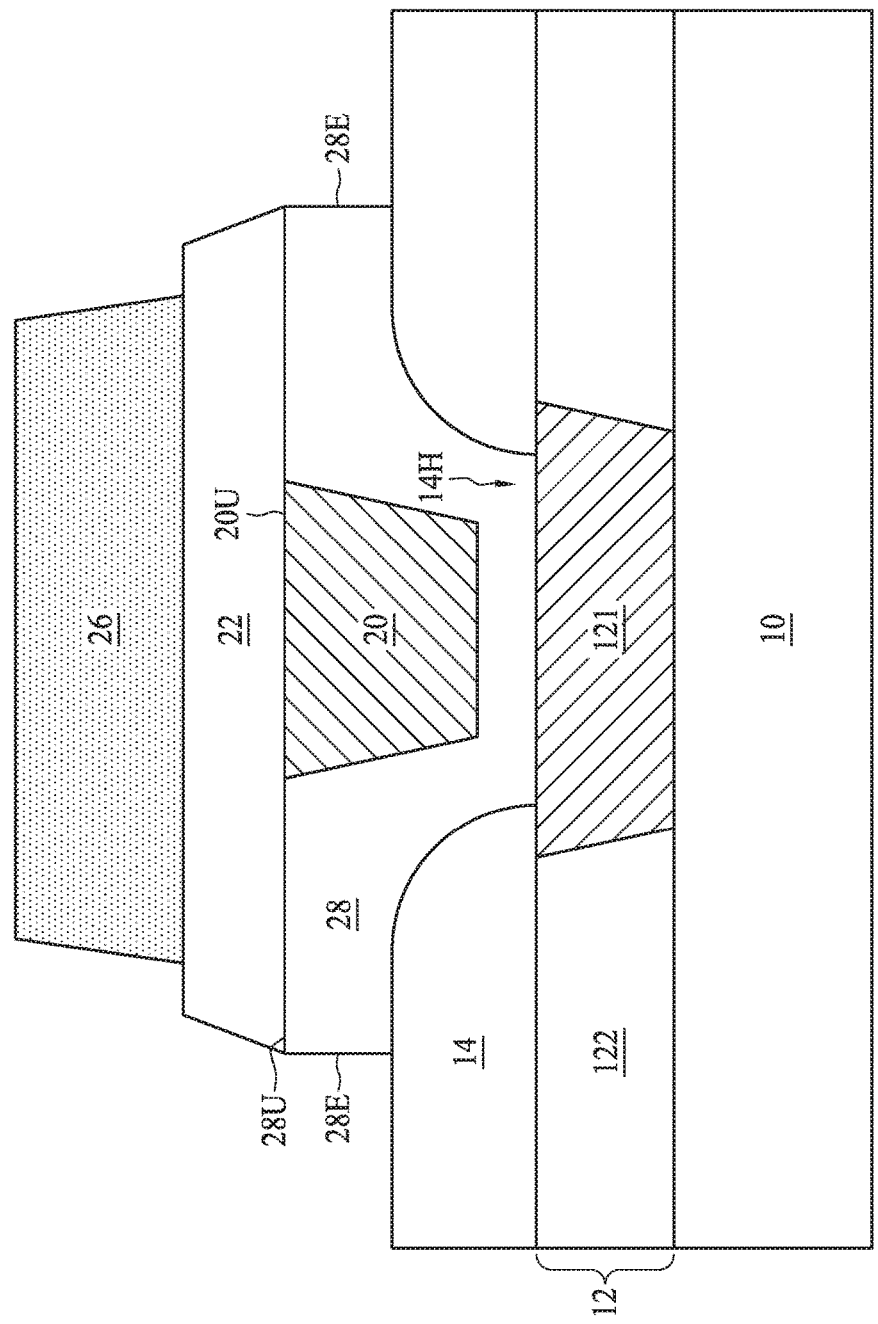

As depicted in FIG. 2E, the third conductive layer 24 is patterned by, e.g., photolithography and etching technique, to form a top electrode 26. In some embodiments, the switching layer 22 is patterned, and configured as a data storage layer. In some embodiments, the switching layer 22 may be patterned along with the third conductive layer 24, but not limited thereto. In some embodiments, the first conductive layer 16 is patterned to form a first bottom electrode 28. In some embodiments, the first conductive layer 16 may be patterned along with the switching layer 22, but not limited thereto. The first bottom electrode 28 has two edges 28E opposite to each other, and an upper surface 28U. In some embodiments, the upper surface 28U of the first bottom electrode 28 and the upper surface 20U of the second bottom electrode 20 are substantially coplanar. In some embodiments, the second bottom electrode 20 is between the edges 28E of the first bottom electrode 28 and exposed from the upper surface 28U of the first bottom electrode 28.

Figure 2F:
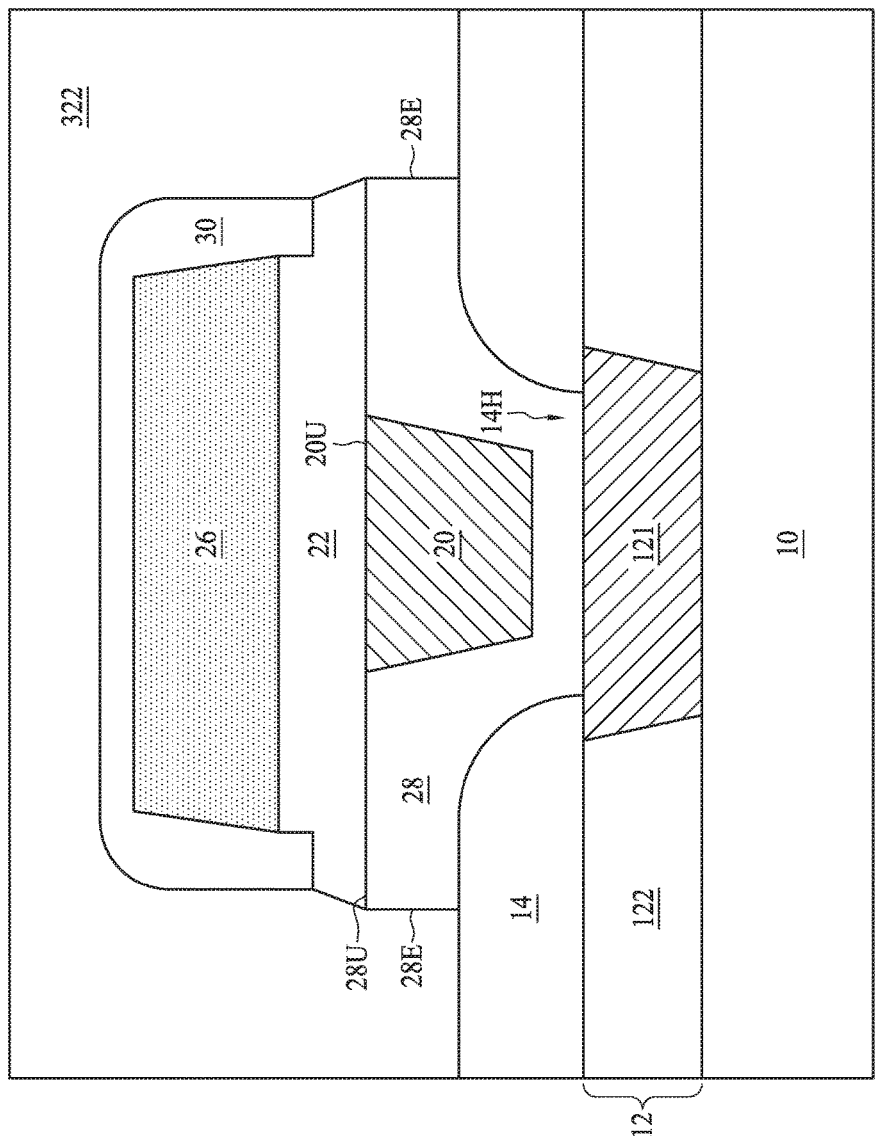

As depicted in FIG. 2F, a passivation layer 30 can be optionally formed. In some embodiments, the passivation layer 30 is insulative. In some embodiments, the passivation layer 30 covers the top electrode 26. In some embodiments, the passivation layer 30 covers the switching layer 22. In some embodiments, the material of the passivation layer 30 includes dielectric material such as silicon oxide, silicon nitride, silicon oxynitride or the like, but is not limited thereto. In some embodiments, a top inter-layer dielectric (ILD) layer 322 is formed over the substrate 10, covering the passivation layer 30. In some embodiments, the material of the top ILD layer 322 may include dielectric material such as low-k dielectric material with a dielectric constant less than 2.0 or the like, but is not limited thereto.

Figure 2G:
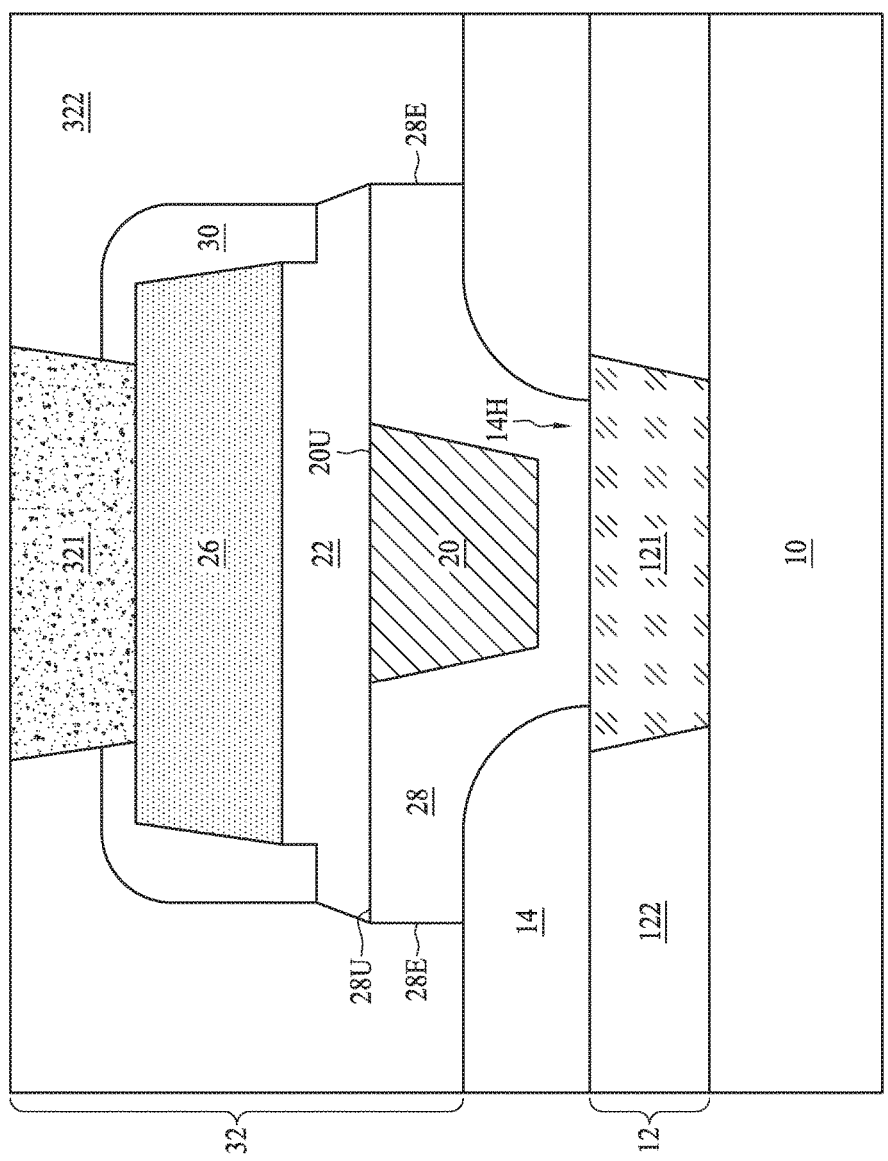

As depicted in FIG. 2G, the top ILD layer 322 and the passivation layer 30 may be patterned by, e.g., photolithography and etching technique, to expose a portion of the top electrode 26. In some embodiments, a top metallization layer 321 is formed, and electrically connected to the top electrode 26 to form a semiconductor device 1. In some embodiments, the material of the top metallization layer 321 may include metal or alloy such as copper, tungsten, alloy thereof or the like. In some embodiments, the top metallization layer 321 and the top ILD layer 322 form a top interconnect structure 32.

Figure 3:
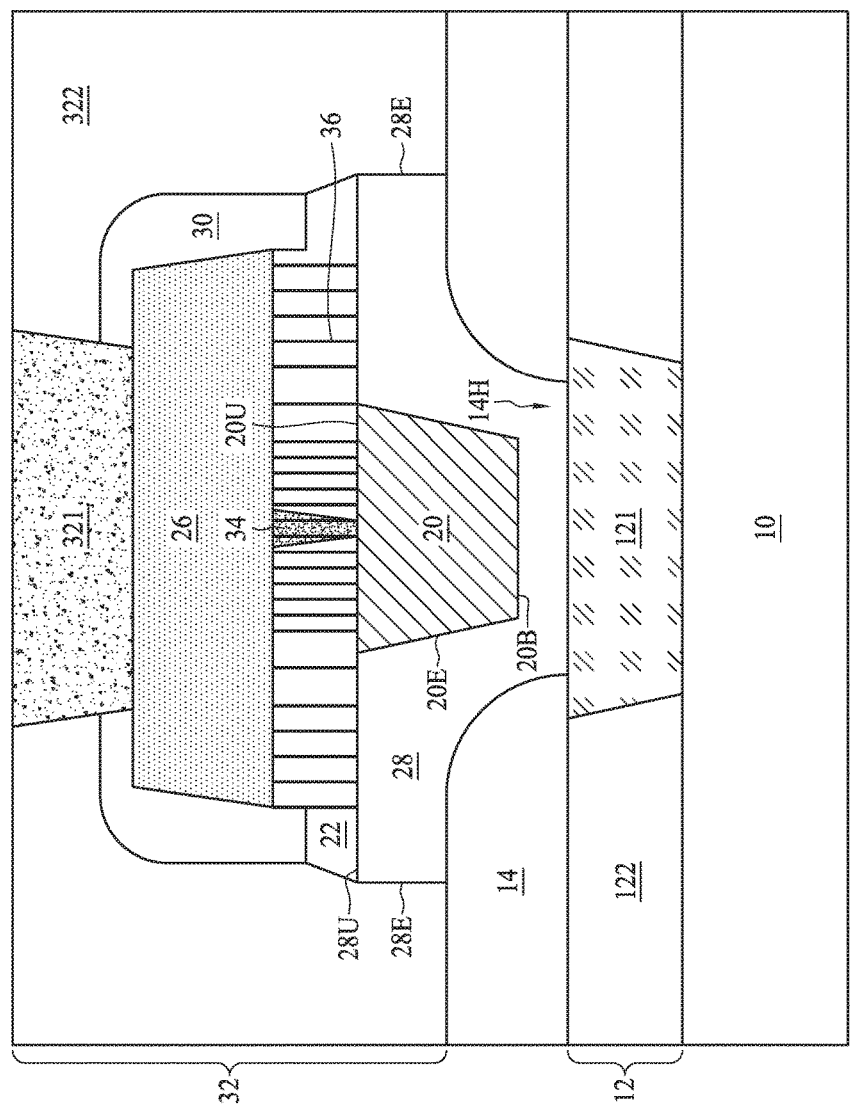
FIG. 3 is a schematic cross-sectional view of a semiconductor device according to one or more embodiments of the present disclosure.

FIG. 3 is a schematic cross-sectional view of a semiconductor device according to one or more embodiments of the present disclosure. As shown in FIG. 3, the semiconductor device 1 includes a bottom electrode including a first bottom electrode 28 and a second bottom electrode 20 laterally surrounded by the first bottom electrode 28. In some embodiments, the second bottom electrode 20 is partially embedded in the first bottom electrode 28, and exposed from the upper surface 28U of the first bottom electrode 28. In some embodiments, a bottom surface 20B and at least two edges 20E of the second bottom electrode 20 are surrounded by the first bottom electrode 28. In some embodiments, the first bottom electrode 28 and the second bottom electrode 20 are in contact with the switching layer 22. In some embodiments, an intervening layer may be interposed between the switching layer 22 and the first and second bottom electrodes 28, 20.

The second bottom electrode 20 has a higher work function than the first bottom electrode 28. In some embodiments, the work function difference between the second bottom electrode 20 and the first bottom electrode 28 is, but not limited to be, substantially greater than 0.3 eV. The second bottom electrode 20 has a higher conductivity (i.e. lower resistivity) than the first bottom electrode 28. In some embodiments, the conductivity ratio of the second bottom electrode 20 to the first bottom electrode 28 is, but not limited to be, substantially greater than 2, i.e., the resistivity ratio of the second bottom electrode 20 to the first bottom electrode 28 is, but not limited to be, substantially less than ½.

In some embodiments, the semiconductor device 1 may be memory device such as a resistive random access memory (RRAM), a conductive bridging random access memory (CBRAM) or the like. In operation and during manufacture, voltages may be applied between the top electrode 26 and the first and second bottom electrode 28, 20. For example, a voltage may be applied between the top electrode 26 and the first and second bottom electrodes 28, 20 to form the one or more conductive filaments 34 and/or to trigger reactions in the switching layer 22. As another example, a voltage may be applied between the top electrode 26 and the first and second bottom electrodes 28, 20 to read, set or erase the semiconductor device 1. In some embodiments, the switching layer 22 includes a data storage region having a variable resistance representing a unit of data, such as a bit of data. The variable resistance is configured to vary in response to external electric fields generated by the top electrode 26 and the first and second bottom electrodes 28, 20. The variable resistance varies between comparatively low and high resistance states depending upon whether one or more conductive filaments 34 are fully or partially formed in switching layer 22. For example, the variable resistance is in a low resistance state when the one or more conductive filaments 34 are fully formed, and the variable resistance is in a comparatively high resistance state when the one or more conductive filaments 34 are partially formed.

Figure 4:
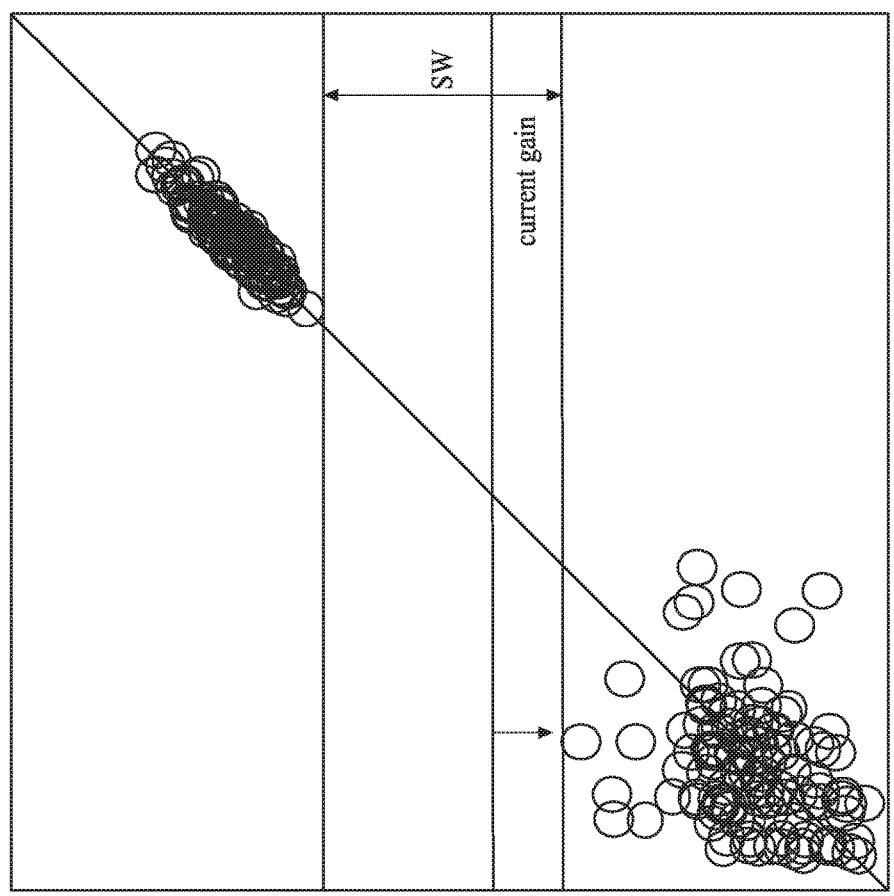
FIG. 4 is a schematic diagram illustrating a variance of switching window of a semiconductor device with and without a second bottom electrode with higher work function and higher conductivity incorporated in a first bottom electrode with lower work function and lower conductivity according to one or more embodiments of the present disclosure.

The work function of the second bottom electrode 20 is higher than the work function of the first bottom electrode 28, and thus the second bottom electrode 20 gets more negative than the first bottom electrode 28 when a negative voltage is applied to the bottom electrode. Consequently, the higher work function of the second bottom electrode 20 aligned near the center of the switching layer 22 makes the electrical field 36 near the central region higher than the electrical field 36 at the edge of the switching layer 22. Accordingly, the conductive filament 34 is apt to form near the center than the edge of the switching layer 22. Since the interaction of the conductive filament 34 and the edge of the switching layer 22 may cause leakage and tailing and reliability issue, the conductive filament 34 located away from the edge of the switching layer 22 is able to reduce tailing bits during cycling (endurance test) or baking (retention test). FIG. 4 is a schematic diagram illustrating a variance of switching window of a semiconductor device with and without a second bottom electrode with higher work function and higher conductivity incorporated in a first bottom electrode with lower work function and lower conductivity according to one or more embodiments of the present disclosure. As shown in FIG. 4, with the second bottom electrode with higher work function and higher conductivity, the switching window SW is increased by a current gain. Also, the forming voltage can be decreased since the electric field is concentrated at the center of the switching layer 22 with the second bottom electrode 20 having high work function and high conductivity located near the center of the switching layer 22.

In one exemplary aspect, a semiconductor device includes a first bottom electrode, a second bottom electrode, a switching layer and a top electrode. The first bottom electrode has two edges opposite to each other, and an upper surface. The second bottom electrode is between the edges of the first bottom electrode and exposed from the upper surface of the first bottom electrode. The switching layer is over the first bottom electrode and the second bottom electrode. The top electrode is over the switching layer.

In another aspect, a semiconductor device includes a first bottom electrode, a second bottom electrode, a switching layer and a top electrode. The second bottom electrode is at least partially embedded in the first bottom electrode, wherein a work function of the second bottom electrode is higher than a work function of the first bottom electrode, and a conductivity of the second bottom electrode is higher than a conductivity of the first bottom electrode. The switching layer is over the first bottom electrode and the second bottom electrode. The top electrode is over the switching layer.

In yet another aspect, a method for manufacturing a semiconductor device is provided. A first bottom electrode and a second bottom electrode are formed over a substrate, wherein the second bottom electrode is between two edges of the first bottom electrode and exposed from an upper surface of the first bottom electrode. A switching layer is formed over the first bottom electrode and the second bottom electrode. A top electrode is formed over the switching layer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first bottom electrode having two edges opposite to each other, and an upper surface;
a second bottom electrode between the edges of the first bottom electrode and exposed from the upper surface of the first bottom electrode wherein a conductivity of the second bottom electrode is higher than a conductivity of the first bottom electrode;
a switching layer over the first bottom electrode and the second bottom electrode; and
a top electrode over the switching layer.

2. The semiconductor device of claim 1, wherein a work function of the second bottom electrode is higher than a work function of the first bottom electrode.

3. The semiconductor device of claim 2, wherein a work function difference between the second bottom electrode and the first bottom electrode is substantially greater than 0.3 eV.

4. The semiconductor device of claim 1, wherein a conductivity ratio of the second bottom electrode to the first bottom electrode is substantially greater than 2.

5. The semiconductor device of claim 1, wherein the first bottom electrode and the second bottom electrode are in contact with the switching layer.

6. The semiconductor device of claim 1, wherein an upper surface of the second bottom electrode and the upper surface of the first bottom electrode are substantially coplanar.

7. The semiconductor device of claim 1, wherein a bottom surface and at least two edges of the second bottom electrode are surrounded by the first bottom electrode.

8. The semiconductor device of claim 1, further comprising a bottom interconnect structure under and electrically connected to the first bottom electrode, and a top interconnect structure over and electrically connected to the top electrode.

9. The semiconductor device of claim 1, further comprising a passivation layer covering the top electrode and the switching layer.

10. A semiconductor device, comprising:
a first bottom electrode;
a second bottom electrode partially embedded in the first bottom electrode, wherein a work function of the second bottom electrode is higher than a work function of the first bottom electrode, and a conductivity of the second bottom electrode is higher than a conductivity of the first bottom electrode;
a switching layer over the first bottom electrode and the second bottom electrode; and
a top electrode over the switching layer.

11. The semiconductor device of claim 10, wherein a work function difference between the second bottom electrode and the first bottom electrode is substantially greater than 0.3 eV.

12. The semiconductor device of claim 10, wherein a conductivity ratio of the second bottom electrode to the first bottom electrode is substantially greater than 2.

13. The semiconductor device of claim 10, wherein an upper surface of the second bottom electrode and an upper surface of the first bottom electrode are substantially coplanar.

14. The semiconductor device of claim 10, wherein a material of the first bottom electrode and a material of the second bottom electrode comprise conductive materials with different ingredients.

15. The semiconductor device of claim 10, wherein a material of the first bottom electrode and a material of the second bottom electrode comprise conductive materials with a same ingredient and with different ingredient ratios.

16. The semiconductor device of claim 15, wherein the material of the first bottom electrode and the material of the second bottom electrode comprises metal nitride with different nitrogen concentrations.

17. A semiconductor device, comprising:
a first bottom electrode;
a second bottom electrode including edges laterally surrounded by the first bottom electrode, and an upper surface exposed the first bottom electrode, wherein a work function of the second bottom electrode is higher than a work function of the first bottom electrode;

a switching layer over the first bottom electrode and the second bottom electrode; and a top electrode over the switching layer.

18. The semiconductor device of claim 17, wherein the second bottom electrode includes a bottom surface covered by the first bottom electrode.

19. The semiconductor device of claim 17, wherein an upper surface of the second bottom electrode and the upper surface of the first bottom electrode are substantially coplanar.

\* \* \* \* \*